United States Patent
Higashi et al.

(10) Patent No.: US 7,615,406 B2
(45) Date of Patent: Nov. 10, 2009

(54) ELECTRONIC DEVICE PACKAGE MANUFACTURING METHOD AND ELECTRONIC DEVICE PACKAGE

(75) Inventors: Kazushi Higashi, Osaka (JP); Yukihiro Maegawa, Osaka (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 11/883,166

(22) PCT Filed: Jan. 26, 2006

(86) PCT No.: PCT/JP2006/001209

§ 371 (c)(1),
(2), (4) Date: Jul. 27, 2007

(87) PCT Pub. No.: WO2006/080388

PCT Pub. Date: Aug. 3, 2006

(65) Prior Publication Data

US 2008/0277771 A1    Nov. 13, 2008

(30) Foreign Application Priority Data

Jan. 28, 2005    (JP) .............................. 2005-020710

(51) Int. Cl.
*H01L 21/00* (2006.01)

(52) U.S. Cl. ..................... 438/106; 438/115; 438/667; 257/693; 257/690; 257/698; 257/E23.011; 257/E23.067

(58) Field of Classification Search ................ 257/693, 257/E23.011, 690, 698, E23.067; 438/106, 438/115, 667
See application file for complete search history.

(56) References Cited

U.S. PATENT DOCUMENTS

| | | | |
|---|---|---|---|
| 6,475,877 B1 | 11/2002 | Saia et al. | |
| 6,790,703 B2 | 9/2004 | Saia et al. | |
| 2002/0197767 A1 | 12/2002 | Saia et al. | |
| 2004/0029356 A1 | 2/2004 | Timme et al. | |
| 2004/0104791 A1 | 6/2004 | Satoh et al. | |
| 2004/0106294 A1* | 6/2004 | Lee et al. ..................... | 438/691 |
| 2005/0012169 A1 | 1/2005 | Ikeda et al. | |

(Continued)

FOREIGN PATENT DOCUMENTS

CN          1301039          6/2001

(Continued)

OTHER PUBLICATIONS

Patent Cooperation Treaty (PCT) International Preliminary Report on Patentability, issued Jul. 31, 2007 in International Application No. PCT/JP2006/301209.

*Primary Examiner*—Tu-Tu V Ho
(74) *Attorney, Agent, or Firm*—Wenderoth, Lind & Ponack, L.L.P.

(57) ABSTRACT

By joining a lid member to a base member, internal electrodes put in contact with the lid member and an electronic device connected to the internal electrodes are placed in an internal space located in between the base member and the lid member. By performing etching from a surface of the lid member on a side opposite from the base member by a prescribed method, through holes that reach the surface of the internal electrodes are formed. A conductive material is applied to the through holes, and external electrodes connected to the internal electrodes are formed in a plane, completing a thin type electronic device package.

14 Claims, 10 Drawing Sheets

U.S. PATENT DOCUMENTS

| | | | |
|---|---|---|---|
| 2005/0095835 A1* | 5/2005 | Humpston et al. | 438/613 |
| 2005/0104204 A1* | 5/2005 | Kawakubo et al. | 257/724 |

FOREIGN PATENT DOCUMENTS

| | | |
|---|---|---|
| CN | 1495999 | 5/2004 |
| JP | 2001-308443 | 11/2001 |
| JP | 2004-80221 | 3/2004 |
| JP | 2004-160654 | 6/2004 |
| JP | 2005-19966 | 1/2005 |

* cited by examiner

ELECTRONIC DEVICE PACKAGE MANUFACTURING METHOD AND ELECTRONIC DEVICE PACKAGE

TECHNICAL FIELD

The present invention relates to a manufacturing method of an electronic device package in which an electronic device is placed in between a first member and a second member and relates to the electronic device package.

BACKGROUND ART

As a method for sealing a semiconductor device, a surface acoustic wave device and a variety of other electronic devices, there has conventionally been the practice of housing an electronic device in a container, supplying a solder, a glass material, an adhesive and so on to the upper surface of the container and sealing the inside of the container by joining a plate of a metal or ceramic. Moreover, in recent years, a method for manufacturing an electronic device package reduced in thickness by joining together two substrates in a pile processed complexly in an electronic device package has been proposed. For example, Japanese unexamined patent publication No. 2004-80221 (Document 1) discloses a technique for joining a cover member at which a through hole has already been formed to a piezoelectric substrate where an internal electrode connected to an SAW (Surface Acoustic Wave) device in a manner that the through hole and the electrode overlap each other and forming an external electrode that is connected from the outside to the internal electrode via the through hole while sealing the SAW device.

Moreover, for example, Japanese unexamined patent publication No. 2001-308443 (Document 2) discloses a technique for electrically connecting metal film patterns of both principal surfaces of a silicon substrate on both the principal surfaces of which metal film patterns have been formed by providing a through hole at a silicon substrate by anisotropic etching.

DISCLOSURE OF INVENTION

When the cover member that serves as a lid at which the through hole is formed is joined to the piezoelectric substrate that serves as a base as in Document 1, it is sometimes the case where the joining cannot easily be performed due to a deformation generated in the cover depending on the forming method of the through hole. Moreover, if it is tried to achieve a further reduction in the thickness of the electronic device package by reducing the thickness of the member that serves as the lid (hereinafter referred to as a "lid member") or the member that serves as the base (hereinafter referred to as a "base member"), these members need to be more carefully handled, failing in simply joining the lid member with the base member.

An object of the present invention is to solve the aforementioned issues and to provide a manufacturing method of an electronic device package in which an electronic device is placed between a first member and a second member, capable of easily joining the second member to the first member in manufacturing the electronic device package, and the electronic device package.

In accomplishing the above object, the present invention is constituted as follows.

According to a first aspect of the present invention, there is provided an electronic device package manufacturing method comprising:

joining a first member with a second member via a plurality of internal electrodes so that an electronic device connected to the internal electrodes is placed between the first member and the second member;

forming through holes between a surface opposite from a joint surface with the first member and joint surfaces of the internal electrodes at the second member; and placing a conductive material in the through holes so as to be connected to the internal electrodes, thereby forming a plurality of external electrodes on the surface located on the opposite side of the second member.

According to a second aspect of the present invention, there is provided the electronic device package manufacturing method as defined in the first aspect, wherein the joining of the first member with the second member is performed by joining the second member of a plate-shaped member to the first member via the internal electrodes.

According to a third aspect of the present invention, there is provided the electronic device package manufacturing method as defined in the second aspect, further comprising:

reducing the second member in a thickness, before forming the through holes after joining the first member and the second member.

According to a fourth aspect of the present invention, there is provided the electronic device package manufacturing method as defined in the third aspect, wherein the second member is reduced in a thickness so that the second member comes to have a thickness of not smaller than 25 μm and not greater than 90 μm.

According to a fifth aspect of the present invention, there is provided the electronic device package manufacturing method as defined in the first aspect, wherein the through holes are formed by subjecting the second member to anisotropic etching.

According to a sixth aspect of the present invention, there is provided the electronic device package manufacturing method as defined in the first aspect, further comprising:

forming an insulating layer on an inner peripheral surface of each of the through holes of the second member formed of a conductive material or a semiconductive material, before placing the conductive material in each of the through holes after forming the through holes at the second member.

According to a seventh aspect of the present invention, there is provided the electronic device package manufacturing method as defined in the first aspect, wherein a conductive material in a paste form as the conductive material is placed in each of the through holes.

According to an eighth aspect of the present invention, there is provided the electronic device package manufacturing method as defined in the first aspect, wherein, by joining one of the first and the second members that has an annular metal projection portion on the joint surface with the other of the first and the second members that has an annular metal joining portion corresponding to the annular metal projection portion on the joint surface via the internal electrodes under a depressurized environment, so that the metal projection portion and the metal joining portion are metallically joined together, the internal electrodes and the electronic device are placed between the first member and the second member, forming a depressurized sealed space of an annular metal wall portion formed of the metal projection portion and the metal joining portion.

According to a ninth aspect of the present invention, there is provided the electronic device package manufacturing method as defined in the eighth aspect, wherein, after the conductive material is placed in each of the through holes, a conductive cover portion, which covers exposed surfaces of the conductive material placed and each of the through holes, is placed on the surface located on the opposite side of the second member.

According to a tenth aspect of the present invention, there is provided the electronic device package manufacturing method as defined in the ninth aspect, wherein the conductive cover portion is formed by a PVD method.

According to an eleventh aspect of the present invention, there is provided the electronic device package manufacturing method as defined in the eighth aspect, wherein the joining of the metal projection portion with the metal joining portion is performed by metal joining at a normal temperature.

According to a twelfth aspect of the present invention, there is provided the electronic device package manufacturing method as defined in the eighth aspect, wherein the electronic device having a movable structure is placed in the depressurized sealed space.

According to a thirteenth aspect of the present invention, there is provided the electronic device package manufacturing method as defined in the first aspect, wherein, by joining the first member on the joint surface of which the electronic device and a plurality of auxiliary electrodes connected to the electronic device are placed with the second member on the joint surface of which the internal electrodes are placed, the auxiliary electrodes and the internal electrodes are joined together.

According to a fourteenth aspect of the present invention, there is provided an electronic device package comprising:
- a first member;
- a second member that is formed of a conductive material or a semiconductive material and placed facing the first member;
- an electronic device placed between the first member and the second member;
- a plurality of internal electrodes that are connected to the electronic device and placed between the first member and the second member so as to join both the members together;
- an insulating layer placed on inner peripheral surfaces of a plurality of through holes that are formed in between a surface opposite from joint surfaces with the first member at the second member and joint surfaces with the internal electrodes;
- a plurality of external electrodes that are connected to the internal electrodes with a conductive material placed in the through holes on which the insulating layer is placed and formed on the surface located on the opposite side of the second member; and
- an annular metal wall portion that forms a depressurized sealed space in which the internal electrodes and the electronic device are placed in between the first member and the second member.

According to a fifteenth aspect of the present invention, there is provided the electronic device package as defined in the fourteenth aspect, wherein each of the external electrodes has a conductive cover portion that covers exposed surfaces of the conductive material placed and the through holes on the surface located on the opposite side of the second member.

According to a sixteenth aspect of the present invention, there is provided the electronic device package as defined in the fourteenth aspect, wherein the second member is a plate-shaped member having a thickness of not smaller than 25 μm and not greater than 90 μm.

According to the present invention, in the manufacturing method of the electronic device package in which the first member and the second member are joining together via the respective internal electrodes, and the electronic device is placed between both the members, the second member can easily be joined to the second member by forming the through holes at the second member after joining the first member with the second member.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
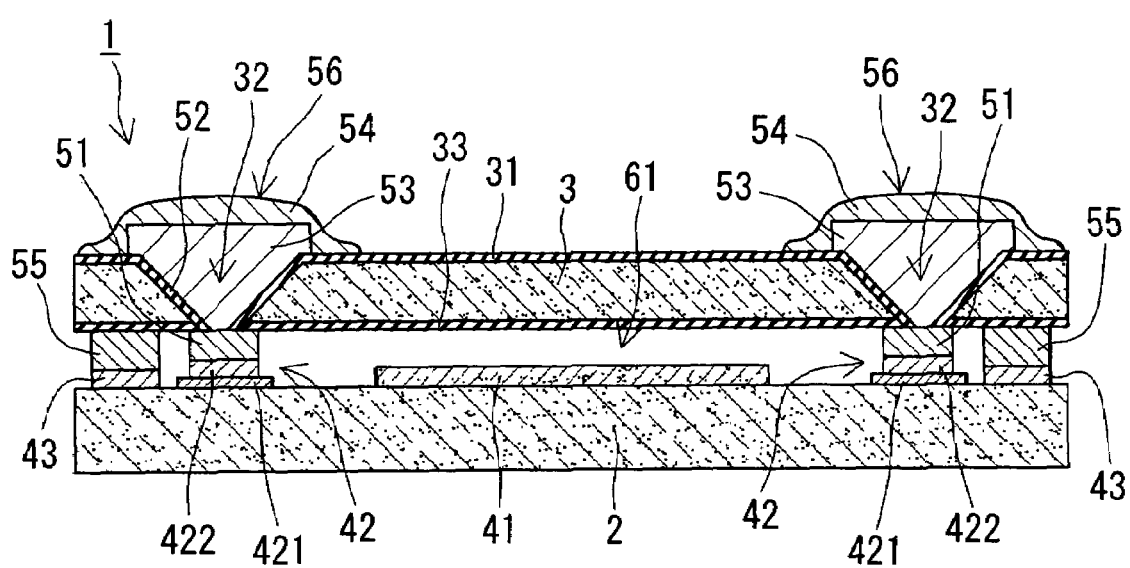
FIG. 1 is a schematic sectional view showing an electronic device package according to one embodiment of the present invention.

Before the description of the present invention proceeds, it is to be noted that like parts are designated by like reference numerals throughout the accompanying drawings.

Hereinbelow, an embodiment of the present invention will be described in detail with reference to the accompanying drawings.

FIG. 1 is a schematic sectional view showing an electronic device package 1 according to one embodiment of the present invention. As shown in FIG. 1, the electronic device package 1 includes a base member (or a base substrate) 2 that is one example of the rectangular plate-shaped first member extending in the horizontal direction, and a lid member (or a substrate used for a lid) 3 that is one example of the rectangular plate-shaped second member extending in the horizontal direction as in the base member 2. Between the base member 2 and the lid member 3 are placed an electronic device 41 and a plurality of internal electrodes 51 which are each connected to the electronic device 41 via auxiliary electrodes 42. In this case, for example, an SAW (Surface Acoustic Wave) filter is used as the electronic device 41. The auxiliary electrodes 42 of FIG. 1 are formed to have, for example, a two-layer structure of conductive materials constructed of an aluminum (Al) layer 421 and a gold (Au) layer 422 in order from the base member 2 side, and the internal electrodes 51 are formed of gold. The base member 2 is formed of lithium tantalate ($LiTaO_3$), and the lid member 3 is formed of silicon (Si) that is one example of the semiconductive material. It is noted that the lid member 3 may be formed of a conductive material or a nonconductive material.

The lid member 3 has through holes 32 which are formed after being joined to the base member 2 via the internal electrodes 51 as described later and extend from a surface 31 of the lid member 3 opposite from the joint surface with the base member 2 to the joint surfaces of the internal electrodes 51. An insulating layer 52 ($SiO_2$ layer, in concrete) is formed on the inner surfaces of the through holes 32 and on the surface 31. The insulating layer 52 is formed also on the joint surface of the lid member 3 with the base member 2. Inside the through holes 32 are formed conductive portions 53 into which a conductive adhesive including silver (Ag) (or gold or copper (Cu)) particles as a conductive material is given (filled), and the conductive portions 53 are electrically connected to the internal electrodes 51. Moreover, the through holes 32 have a cross section of, for example, a square shape roughly along the surface of the lid member 3, and the area of the cross section has a shape that is gradually reduced toward the base member 2 side. That is, the conductive portions 53 have a roughly quadrangular pyramid shape whose bottom surface has a square shape facing upward in the figure on the lower side (base member 2 side) of the surface 31. Furthermore, the conductive portions 53 are formed to heap also on the upper side in the figure from the surface 31 of the lid member 3. Conductive cover portions 54 that individually cover the through holes 32 together with the conductive portions 53 are provided, forming bump-shaped (or protuberance-shaped) external electrodes 56 to be electrically connected to the outside of the electronic device package 1.

Moreover, in the electronic device package 1 as shown in FIG. 1, an annular metal wall portion (or annular metal projection portion) 55 placed enclosing the electronic device 41, the auxiliary electrodes 42 and the internal electrodes 51, and an annular metal joining portion 43 put in contact (metallically joined in practice (e.g., metallically joined at normal temperature) as described later) with the surface on the base member 2 side of the metal wall portion 55 are provided along the outer edges of the rectangular lid member 3 and the base member 2. As described above, by virtue of the provision of the annular metal wall portion 55 and the annular metal joining portion 43 that are joined together, an internal space 61 in which the electronic device 41, the auxiliary electrodes 42 and the internal electrodes 51 are placed in between the base member 2 and the lid member 3 is put in a sealed state with the metal wall portion 55 and the metal joining portion 43. It is noted that the internal space 61 is depressurized as described later and allowed to be called a depressurized sealed space. This prevents the occurrence of a trouble in the operation of the electronic device that has a movable structure as in the SAW filter due to the existence of excessive air in the internal space 61 or the influence of the external environment.

Figure 2:
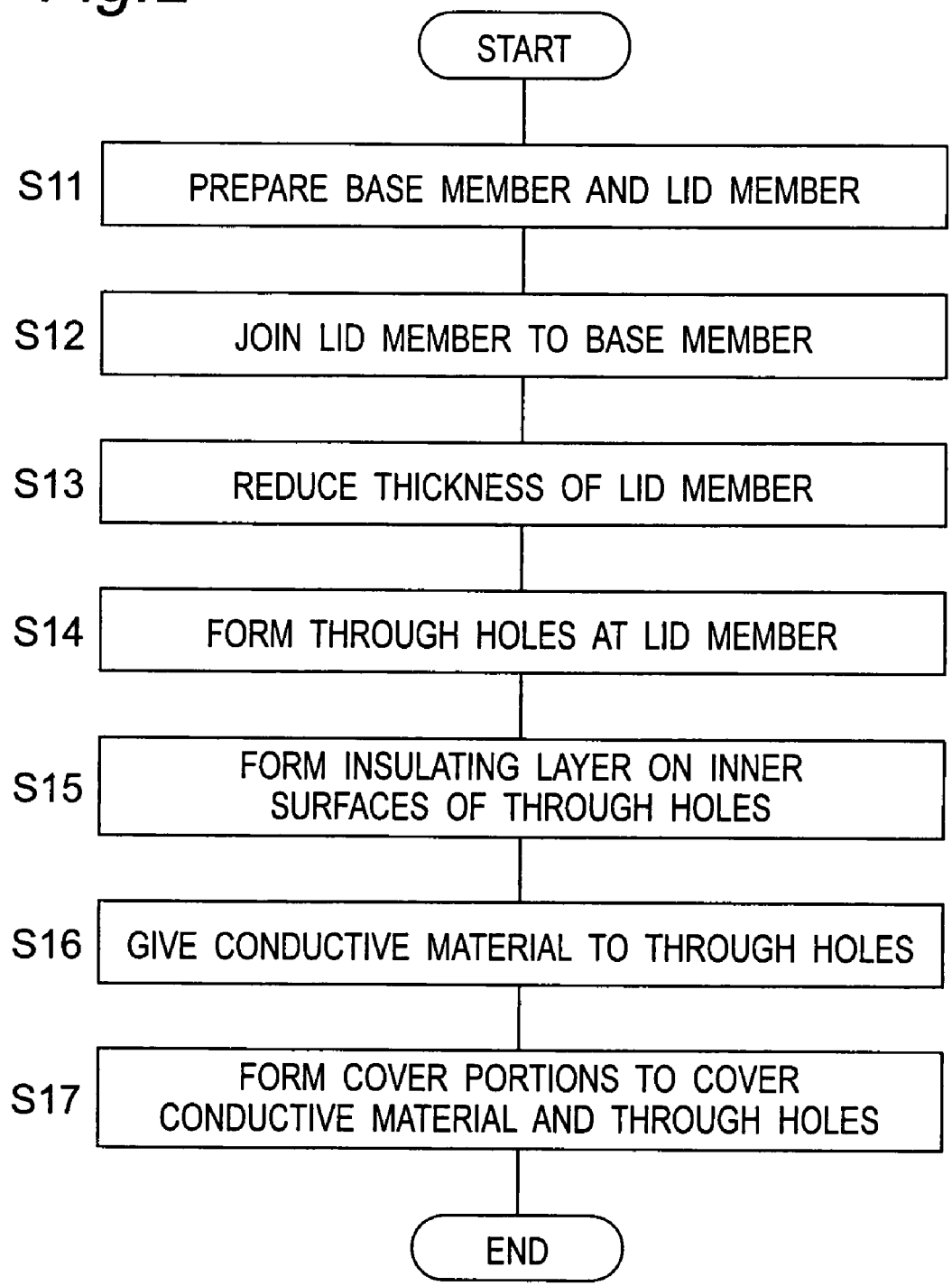
FIG. 2 is a flow chart showing the flow of processing for manufacturing the electronic device package of the above embodiment.

A method for manufacturing the electronic device package 1 shown in FIG. 1 is described next. FIG. 2 shows a flow chart showing the flow of processing for manufacturing the electronic device package 1 for the sake of explanation.

First of all, as shown in FIG. 2, a first substrate (corresponding to an assembly of a plurality of base members 2) having a plurality of electronic devices and auxiliary electrodes and a second substrate (corresponding to an assembly of a plurality of lid members 3) having a plurality of internal electrodes and so on are prepared (step S11).

Figure 3:
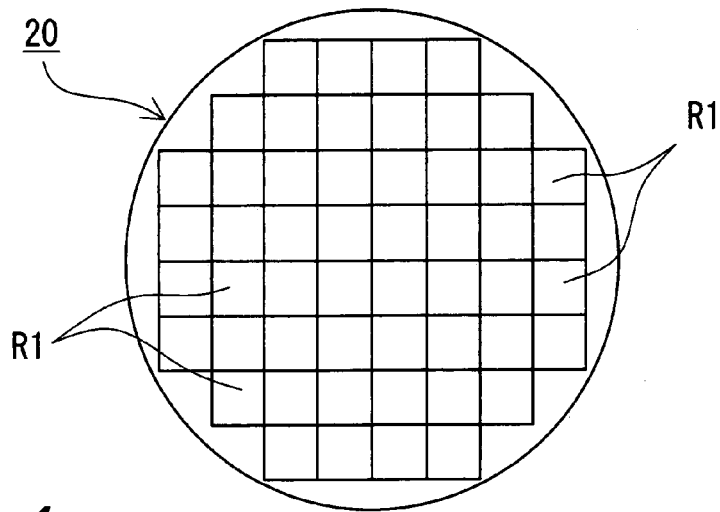
FIG. 3 is a schematic plan view showing a first substrate before it is separated into a plurality of individual base members.

In this case, a schematic plan view of the first substrate 20 corresponding to the assembly of the plurality of base members 2 is shown in FIG. 3. As shown in FIG. 3, a plurality of regions R1 each of which constitutes one electronic device package 1 (one rectangular region in FIG. 3, so-called a die) are set in the first substrate 20, and one member after being cut in each region in a dicing step described later becomes a plate-shaped base member 2 in the electronic device package 1 of FIG. 1. In the following description, a portion corresponding to one base member 2 in the first substrate 20 before being cut is also referred to merely as the base member 2. It is noted that the first substrate 20 is formed of, for example, lithium tantalate.

Figure 4:
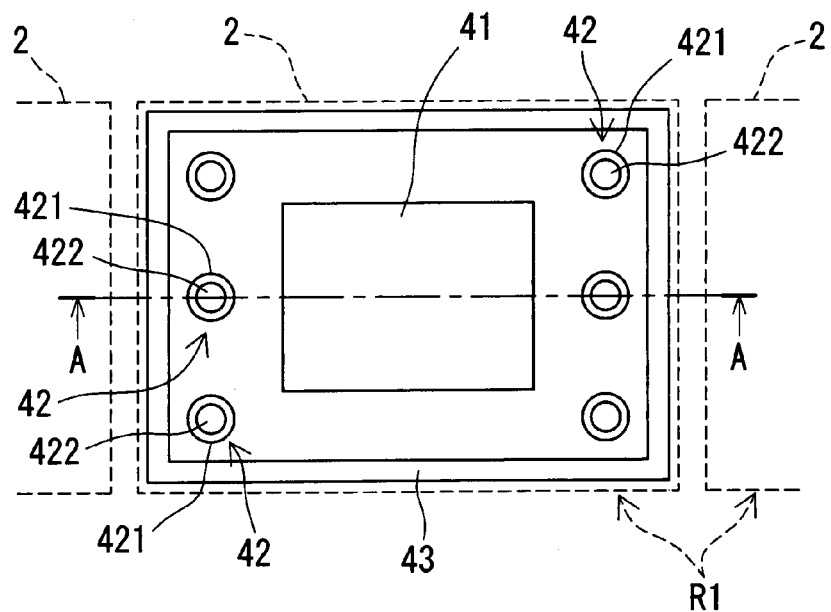
FIG. 4 is a schematic top view of the base member.

FIG. 4 is a schematic top view showing the construction of the inside of the region R1 of the base member 2 on the first substrate 20. In the first substrate 20 before being cut, the base member 2 is made to have a rectangular region of, for example, 650×950 micrometers (μm), and a gap between mutually adjacent base members 2 (dies) is set to, for example, 50 μm. An electronic device 41 is placed at the center of the base member 2, and a plurality of auxiliary electrodes 42 (six auxiliary electrodes 42 in FIG. 4) connected to the electronic device 41 are formed in outer edge portions of the base member 2. Although wiring lines (wiring patterns) and the like connecting the electronic device 41 with the auxiliary electrodes 42 are actually provided on each base member 2 of the first substrate 20, there are not shown in FIG. 4.

Figure 5:
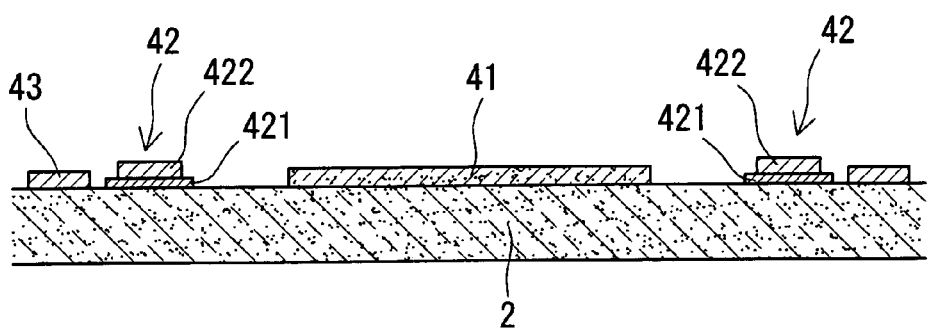
FIG. 5 is a schematic sectional view along the line A-A of the base member of FIG. 4.

FIG. 5 is a schematic sectional view of the base member 2 in the position of the line A-A in FIG. 4. As shown in FIG. 5, each of the auxiliary electrodes 42 has, for example, an aluminum layer 421 of a thickness of 0.1 to 0.2 μm and a gold layer 422 of a thickness of 0.3 to 0.5 μm formed layered on the aluminum layer 421. Moreover, as shown in FIGS. 4 and 5, an annular metal joining portion 43 is formed with, for example, the same thickness as that of as the gold layer 422 on the base member 2 so as to enclose the electronic device 41 and the plurality of auxiliary electrodes 42. The gold layer 422 and the metal joining portion 43 are concurrently formed in a plating process of the first substrate 20.

Moreover, also with regard to the second substrate (not shown) that is an assembly of a plurality of lid members having a plurality of internal electrodes and the like, a plurality of regions R2 (dies) each of which constitutes one electronic device package 1 are set as in the first substrate 20, and one member after being cut in each region becomes the plate-shaped lid member 3 of the electronic device package 1 of FIG. 1. The regions R1 and R2 are formed so that the size and shape of the region R1 in the first substrate 20 become identical to the size and shape of the region R2 in the second substrate.

Figure 6A:
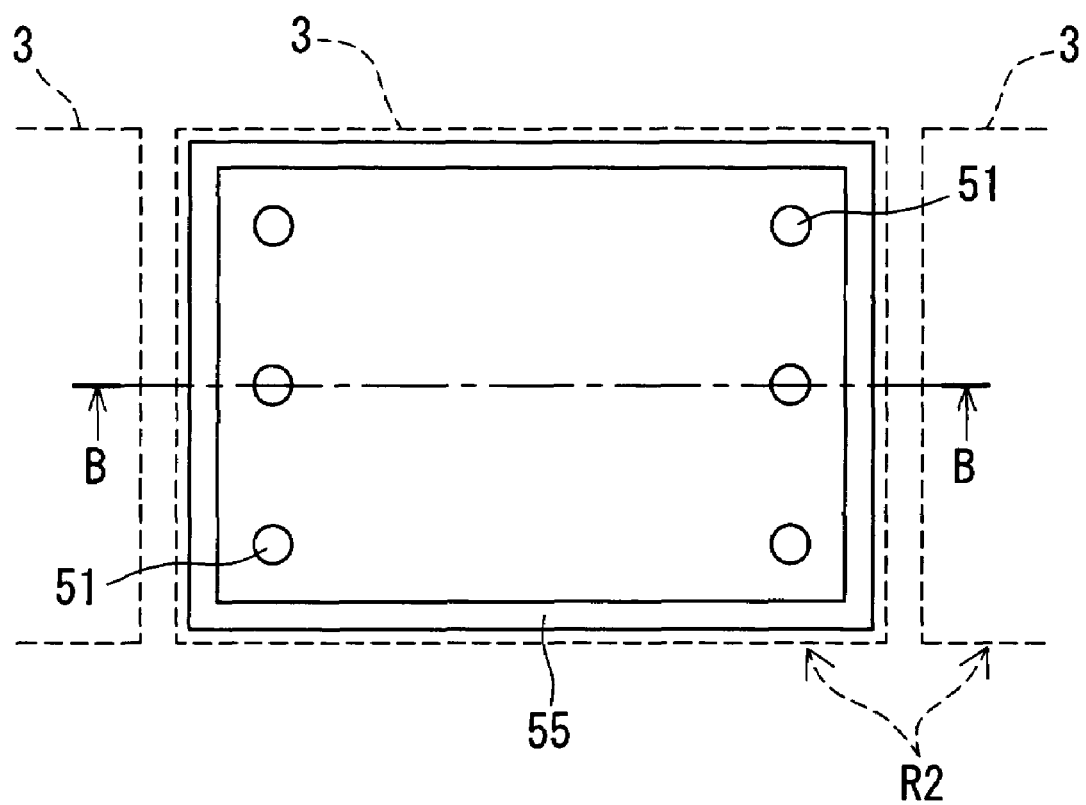
FIG. 6A is a schematic top view of a lid member.
Figure 6B:
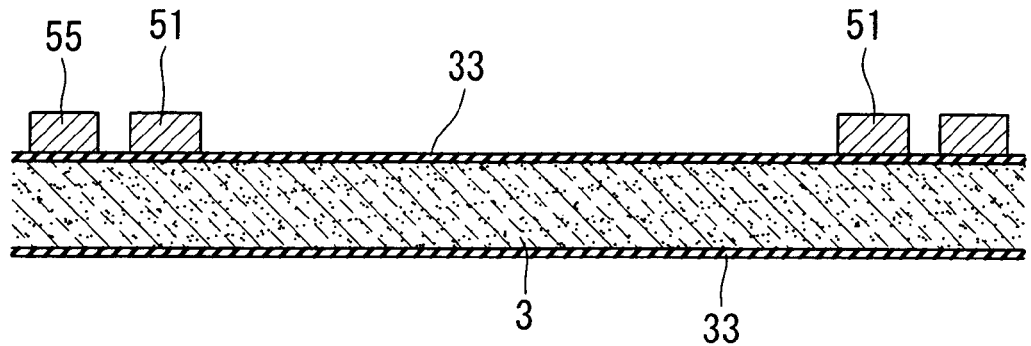
FIG. 6B is a schematic sectional view along the line B-B of the lid member of FIG. 6A.

FIG. 6A is a schematic top view showing the construction of the inside of the region R2 of one lid member 3 on the second substrate, and FIG. 6B is a schematic sectional view along the line B-B of the lid member 3 of FIG. 6A. In a portion corresponding to one lid member 3 of the second substrate, a plurality of internal electrodes 51 are formed in the same positions as those of the auxiliary electrodes 42 of the base member 2. Moreover, a metal wall portion 55 is concurrently formed in the same position as that of the metal joining portion 43 with the same thickness (e.g., 5 μm) in the plating process of the second substrate. In the following description, a portion corresponding to one lid member 3 in the second substrate before being cut is also referred to as a lid member 3. It is noted that the second substrate is formed of silicon.

When the first substrate having the base member 2 and the second substrate having the lid member 3 are prepared, the first substrate 20 is held on a stage in a plasma processing chamber (not shown), and the second substrate is held facing the first substrate 20 by a chuck with the internal electrodes 51 and so on facing the first substrate 20. Subsequently, positional alignment is performed so that the auxiliary electrodes 42 of the base member 2 of the first substrate 20 face the corresponding internal electrodes 51 of the lid member 3 of the second substrate, and the metal joining portion 43 of the base member 2 faces the corresponding metal wall portion 55 of the lid member 3, and the chamber is internally depressurized (e.g., depressurized to 1 Pa or less). Then, argon gas is introduced by a necessary amount into the chamber, and plasma is generated by applying a high frequency voltage of an alternating current between the stage and the chuck, carrying out surface processing (so-called plasma cleaning processing) on the metal joining portion 43 and the auxiliary electrodes 42 of the base member 2 and on the metal wall portion 55 and the internal electrodes 51 of the lid member 3. It is noted that the surface processing is carried out to more reliably perform metal joining described later.

Figure 7A:
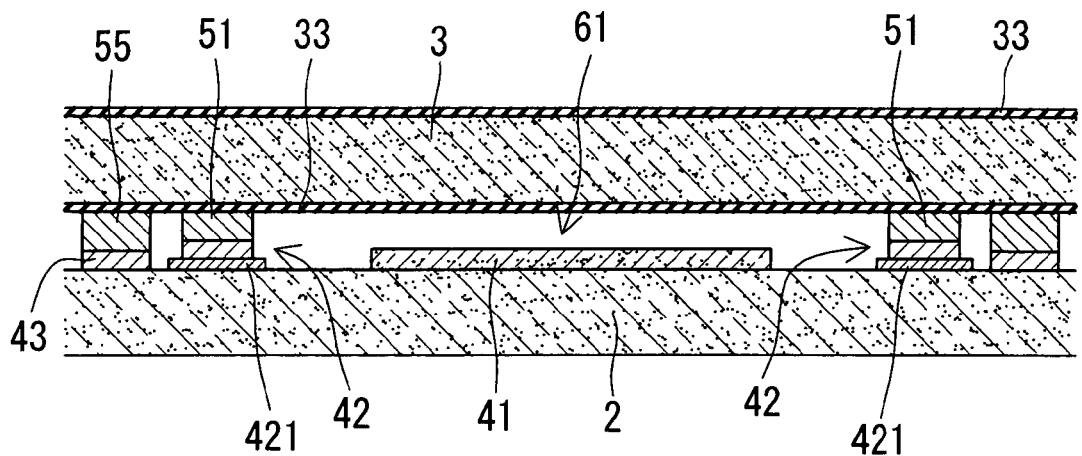
FIG. 7A is a schematic sectional view showing the base member and the lid member immediately after joining.

When the surface processing is completed, the auxiliary electrodes 42 and the metal joining portion 43 of the first substrate 20 are brought in contact with the internal electrodes 51 and the metal wall portion 55, respectively, of the second substrate, and the first substrate 20 and the second substrate are further pressurized in the mutually approaching directions. Then, the auxiliary electrodes 42 and the metal joining portion 43 are metallically joined or, for example, metallically joined at the normal temperature (i.e., joined at the metal atom level) with the corresponding internal electrodes 51 and the metal wall portion 55 while mainly the metal wall portion 55 and the internal electrodes 51 are plastically deformed (preferably, deformed by 1 μm or more) in the height direction by pressurization as shown in FIG. 7A, so that the lid member 3 is joined to the base member 2 via the auxiliary electrodes 42, the internal electrodes 51, the metal joining portion 43 and the metal wall portion 55 (step S12). In the schematic sectional view shown in FIG. 7A (and FIGS. 7B through 7D described later), only one base member 2 of the first substrate and the corresponding one lid member 3 of the second substrate are shown.

In this case, although a difference in height is generated between the auxiliary electrodes 42 and the metal joining portion 43 by the thickness of the aluminum layer 421, no problem is caused by the plastic deformation of the metal wall portion 55 and the internal electrodes 51 generated at the time of joining since the difference is minute. It is acceptable to provide a layer of a height equal to that of the aluminum layer 421 on the base member 2 side of the metal joining portion 43, making the auxiliary electrodes 42 and the metal joining portion 43 have equal height. By thus joining the lid member 3 to the base member 2 under a depressurized environment, the internal space (i.e., depressurized sealed space) 61, which is depressurized and sealed and in which the electronic device 41, the auxiliary electrodes 42 and the internal electrodes 51 are enclosed by the metal joining portion 43 and the metal wall portion 55 is formed in between the base member 2 and the lid member 3, and the electronic device 41 is electrically connected to the internal electrodes 51 via the auxiliary electrodes 42 at the same time. When the metal wall portion 55, the internal electrodes 51 and the like are subjected to a flattening process (leveling process) for uniforming the height position of the jointing portions, it may be a case where such plastic deformation is not achieved. Moreover, the metal joining of the metal wall portion 55, the internal electrodes 51 and the like should preferably be achieved by joining at the normal temperature. This is because a case where reliable joining cannot be achieved occurs due to a concern that a thermal distortion might occur in the base member 2 and the lid member 3 when the temperature is raised by heat generated at the time of joining.

Figure 7B:
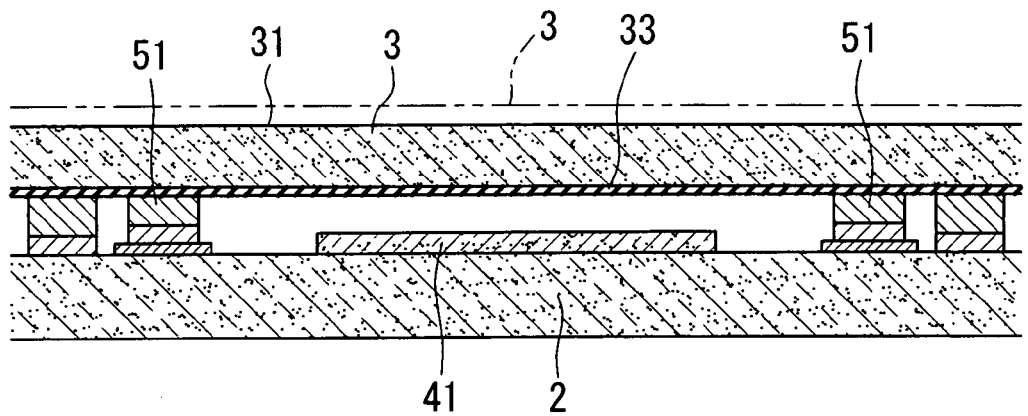
FIG. 7B is a schematic sectional view showing the base member and the lid member after a thickness reducing process.

When the base member 2 and the lid member 3 are joined together, thickness reduction for reducing the thickness of the lid member 3 is performed as shown in FIG. 7B by subjecting the surface of the lid member 3 opposite from the base member 2 to, for example, an abrading process (step S13). In FIG. 7B, the lid member 3 before it is abraded is indicated by a two-dot chain line. In practice, the abrading process is effected on the entire surface of the second substrate opposite from the first substrate, and therefore, a plurality of lid members 3 are concurrently reduced in thickness. The thickness reduction process for reducing the thickness of the lid member 3 may be achieved by sand blasting, wet etching or the like besides the abrading process. As shown in FIGS. 6B and 7A, an $SiO_2$ layer is formed as an insulating layer 33 on the surfaces of the lid members 3 formed of, for example, silicon. However, as shown in FIG. 7B, only the insulating layer 33 that has been placed on the surface of the lid member 3 opposite from the base member 2 is to be removed by the thickness reduction process.

Figure 7C:
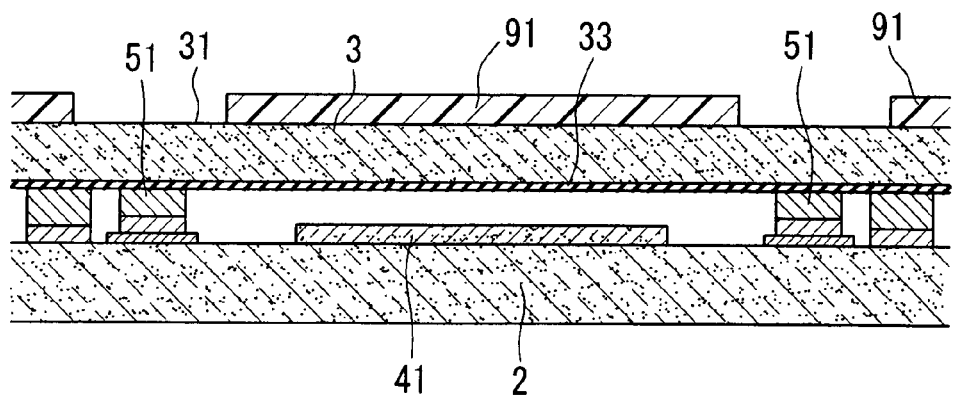
FIG. 7C is a schematic sectional view showing the base member and the lid member after resist film pattern formation.
Figure 7D:
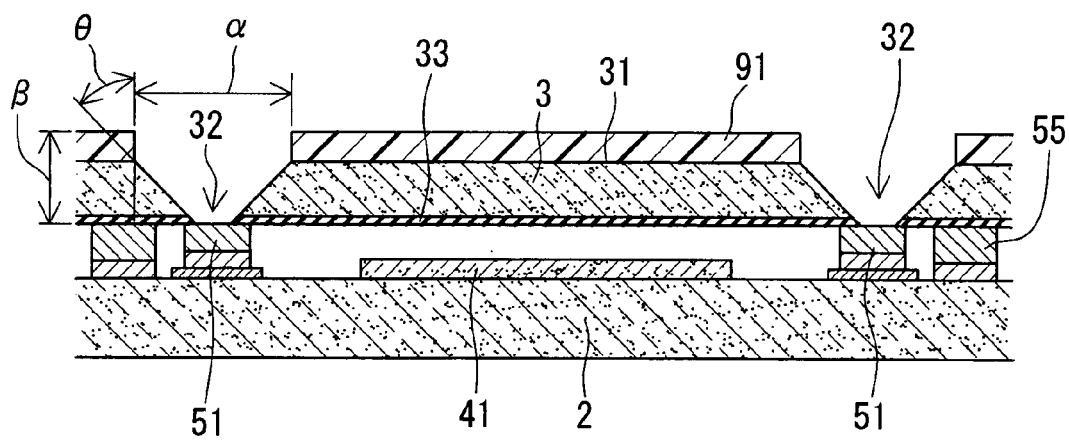
FIG. 7D is a schematic sectional view showing the base member and the lid member after through hole formation.

Subsequently, by forming a resist film on the abraded surface 31 of the lid member 3 opposite from the base member 2 and removing the resist film in regions of a prescribed size above the internal electrodes 51, or, for example, in a plurality of square regions by using a photolithography technique, a pattern of a resist film 91 is formed as shown in FIG. 7C. Then, by giving, for example, a potassium hydroxide (KOH) solution to the surface 31 side of the lid member 3, etching of the lid member 3 progresses in portions (square regions) free of the resist film 91, and through holes 32 that extend from the surface 31 to the joint surfaces of the internal electrodes 51 are formed as shown in FIG. 7D (step S14). In a state in which the wet etching with the potassium hydroxide solution has been effected in the forming process of the through holes 32, the insulating layer 33 is to remain at bottom portions of the portions corresponding to the through holes 32. However, by carrying out, for example, a photoresist process after the wet etching, the insulating layer 33 remaining at the hole bottom portions can be removed, and the through holes 32 that reach the joint surfaces of the internal electrodes 51 can be formed. Moreover, the pattern formed of the resist film 91 is not limited to the square shape as described above but allowed to be formed into, for example, a circular shape or the like. It is desirable to use for example, an acrylic system or the like that has photosensitivity as the resist film 91.

In this case, since a silicon substrate of a crystal orientation (100) is adopted as the material of the second substrate (lid member 3), an etching rate in the direction inclined by a prescribed angle θ with respect to the crystal orientation (direction inclined by the angle θ with respect to the normal direction of the surface 31 in FIG. 7D, and the angle θ is 54.7 degrees in this case) becomes extremely high. Therefore, the through holes 32 have a square shape in the cross section along the horizontal direction (cross section along the surface 31) and the area is gradually reduced toward the base member 2 side. If the through holes 32 are made to have an opening of a minute point on the internal electrodes 51, assuming that the thickness of the lid member 3 is β, then the length α of each side of the square region free of the film 91 on the surface 31 is determined as (2β tan θ). In practice, the size of the opening of the through hole 32 on the internal electrode 51 is made to have a rectangular region of 100 μm square, and therefore, the length α of each side of the square region free of the resist film 91 on the surface 31 is determined on the basis of the above relation.

Figure 11:
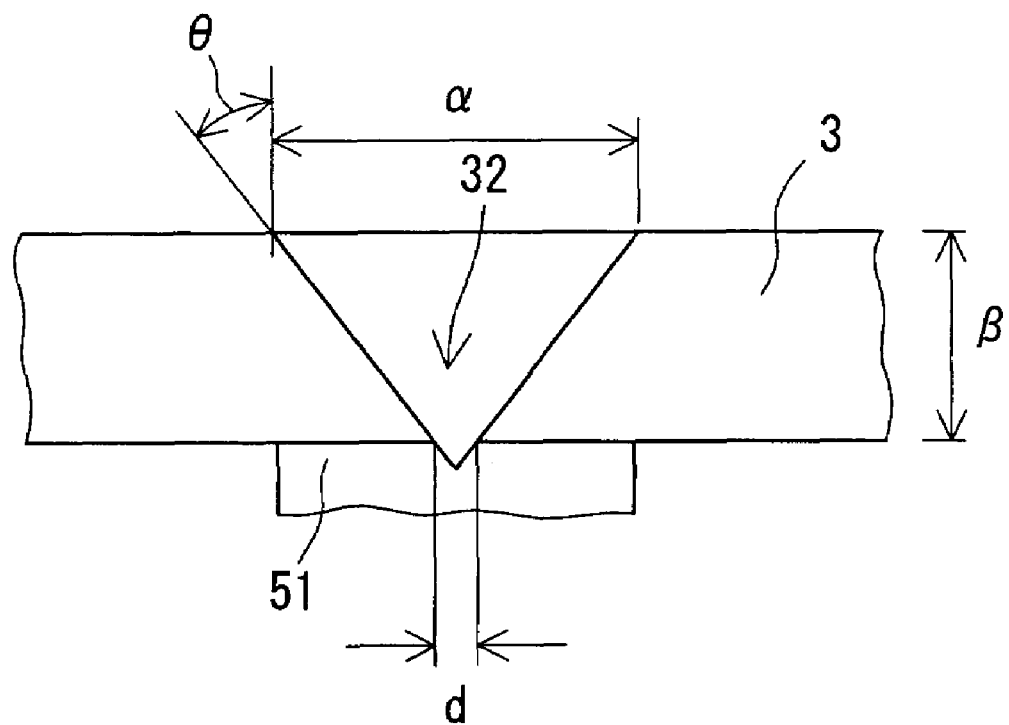
FIG. 11 is a schematic explanatory view showing the shape of the through hole formed at the lid member by the manufacturing method of the above embodiment.

In concrete, as in the schematic explanatory view of the through hole 32 shown in FIG. 11, the length α of each side of the square region free of the resist film 91 on the surface 31 can be expressed as Equation 1 by using the thickness β of the lid member 3 and the size d of the opening of the through hole 32 on the internal electrode 51.

$$\alpha = 1/\{d \cdot (1 + \beta/2 \tan \theta)\} \quad \text{(Eq. 1)}$$

Therefore, if the size d of the opening of the through hole 32 on the internal electrode 51 is determined, the length α of each side of the square region can be determined. The size d of the opening of the through hole 32 on the internal electrode 51 as described above can be determined from the viewpoint of a size required for securing the continuity between the conductive material to be put in the through hole 32 and the internal electrode 51 as described later. The size d is set to, for example, a size of not smaller than 10 μm with respect to the diameter φ90 μm of the internal electrode 51.

Therefore, by managing the pattern shape of the resist film 91 and the thickness of the lid member 3, the through hole 32 is to be formed with high accuracy by anisotropic etching. Moreover, by utilizing anisotropic etching, it also becomes easy to suppress overetching. It is acceptable to use ethylenediamine pyrocatechol (EDP) or the like besides potassium hydroxide for the anisotropic etching of the lid member 3 or to form the lid member 3 of another anisotropically etchable material such as gallium arsenide (GaAs).

Figure 8A:
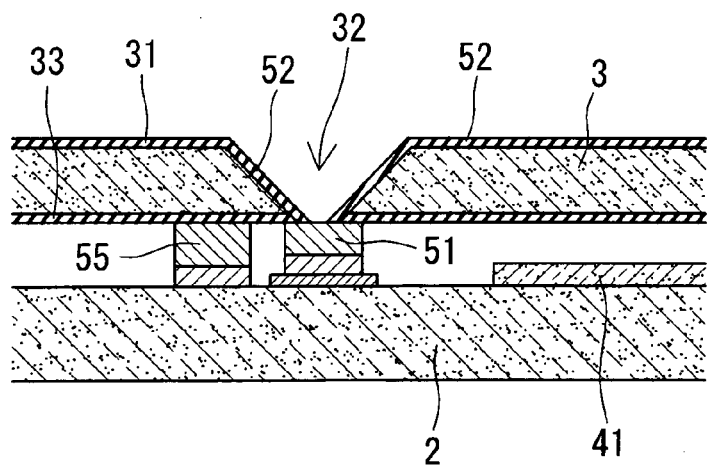
FIG. 8A is a schematic sectional view showing the base member and the lid member after insulating layer formation.
Figure 8B:
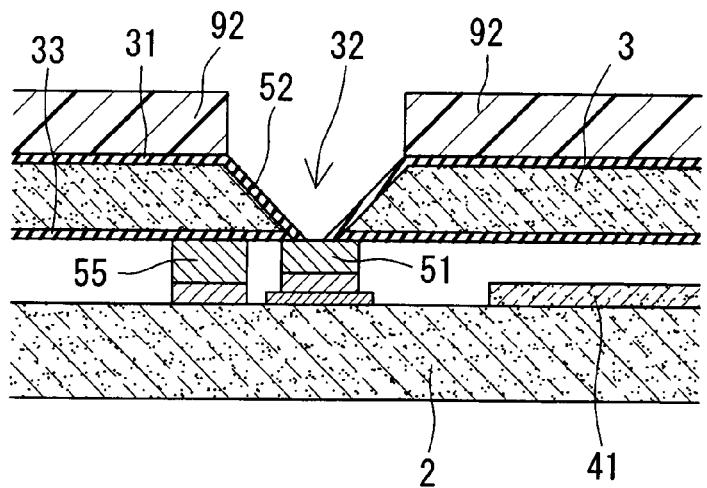
FIG. 8B is a schematic sectional view showing the base member and the lid member after resist film pattern formation.
Figure 8C:
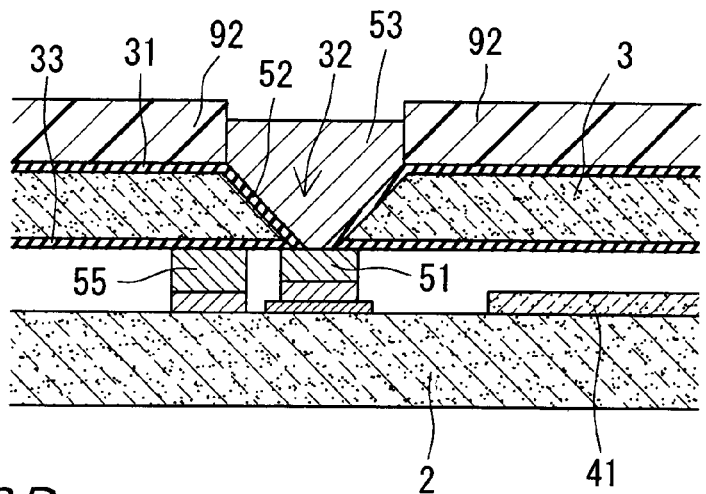
FIG. 8C is a schematic sectional view showing the base member and the lid member after conductive portion formation.

When each of the through holes 32 is formed, a process for removing the resist film 91 is carried out. Subsequently, by subjecting the surface 31 side of the lid member 3 to a thermal oxidation process, the insulating layer 52 that is an oxide (SiO$_2$) is formed on the inner surface (inner peripheral surface) of the through hole 32 and on the entire surface 31 as shown in FIG. 8A (step S15). Then, the pattern of the resist film 92 from which only a region of a prescribed size surrounding the periphery of each of the through holes 32 is formed on the surface 31 of the lid member 3 as shown in FIG. 8B, and by giving a conductive material in a paste form (conductive adhesive in this case) to the through hole 32 until the material heaps to a position higher than the surface 31, the conductive portion 53 electrically connected to the internal electrode 51 is formed as shown in FIG. 8C (step S16). At this time, by virtue of the insulating layer 52 formed on the inner surfaces of the through hole 32 and the surface 31 of the lid member 3, insulation between the lid member 3 formed of the semiconductive material and the conductive portion 53 is secured. The prescribed size that surrounds the periphery of the through hole 32 is a size such that at least the formed conductive portion 53 is not electrically connected to adjacent conductive portions 53. Moreover, the conductive material is given to the through hole 32 so as to bury the opening formed in the hole bottom portion of the through hole 32. Moreover, it is proper to give the conductive material by a method capable of controlling the amount of filling or by, for example, a method of printing or the like.

Figure 8D:
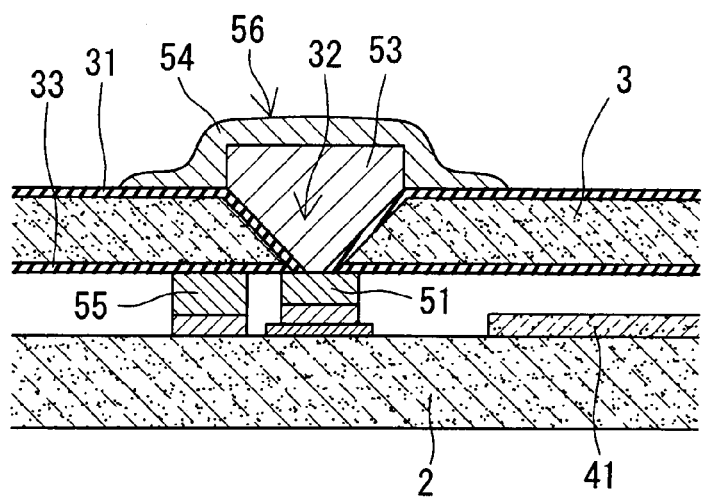
FIG. 8D is a schematic sectional view showing the base member and the lid member after cover portion formation.

When the conductive portion 53 is formed, a removing process of the resist film 92 is carried out. Subsequently, the conductive cover portion 54 that covers the conductive portion 53 and the through hole 32 by sputtering or plating of gold or the like is formed as shown in FIG. 8D (step S17), and the external electrode 56 electrically connected to the internal electrode 51 is formed on the surface 31 of the lid member 3 with the conductive portion 53 and the cover portion 54. Then, the first substrate and the second substrate are cut in an integrated body by dicing, and one member after the cutting becomes the electronic device package 1 shown in FIG. 1. It is noted that the cover portion 54 is provided for the airtightness of the internal space 61, i.e., for more securely sealing the through hole 32. Therefore, in order to further improve the reliability of the sealing property, the cover portion 54 should preferably be performed by a dry process like the PVD (physical vapor deposition processing) method represented by sputtering or the like. When airtightness is not required or depending on the degree of airtightness required, it may be a case where the cover portion 54 is not formed.

As described above, according to the electronic device package manufacturing of the present embodiment shown in the flow chart of FIG. 2, the internal electrode 51 put in contact with the lid member 3 and the electronic device 41 connected to the internal electrode 51 are placed in the internal space 61 located in between the base member 2 and the lid member 3 by joining the lid member 3 to the base member 2. Then, the through hole 32 that reaches the surface of the internal electrode 51 is formed by performing etching from the surface 31 of the lid member 3 opposite from the base member 2 by the prescribed method, and the internal electrode 51 is electrically taken out to the outside of the internal space 61 by giving the conductive material to the through hole 32. In this case, when the lid member at which the through hole has preparatorily been formed is joined to the base member as by the conventional method disclosed in Document 1, it is sometimes the case where the joining cannot easily be performed due to the occurrence of deformation in the cover depending on the forming method of the through hole. However, according to the method of the present embodiment, the lid member 3 can easily be joined to the base member 2 by forming the through hole 32 at the lid member 3 after joining to the base member 2.

Moreover, by virtue of the formation of the internal space 61 in the depressurized sealed state in which the electronic device 41 is placed as a result of the metal joining of the annular metal wall 55 with the annular metal joining portion 43 corresponding to it, highly reliable sealing is achieved in the electronic device package 1, and the reliability of the operation of the electronic device 41 can be secured. Furthermore, by virtue of the formation of the cover portion 54 that covers the conductive portion 53 and the through hole 32, the internal space 61 can more reliably be put into a sealed state. When the internal space 61 is not required to have a high degree of sealing or in another case, it is also possible to use the conductive portion 53 directly as an external electrode and remove the step S17.

According to the present method, the internal electrode 51 provided on the lid member 3 is joined to the auxiliary electrode 42 that is provided on the base member 2 and connected to the electronic device 41 in joining the base member 2 with the lid member 3. Therefore, the electronic device 41 on the base member 2 can be electrically connected to the external electrode while preventing the internal space 61 from communicating with the outside via the through hole 32 in forming the through hole 32 in step S14.

Figure 9A:
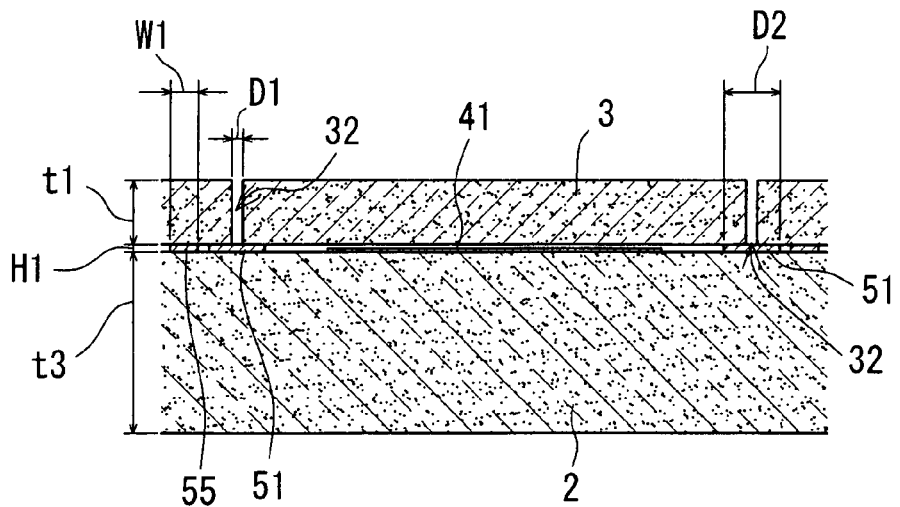
FIG. 9A is a schematic sectional view showing the base member and the lid member after through hole formation by an electronic device package manufacturing method according to a modification example of the above embodiment.
Figure 9B:
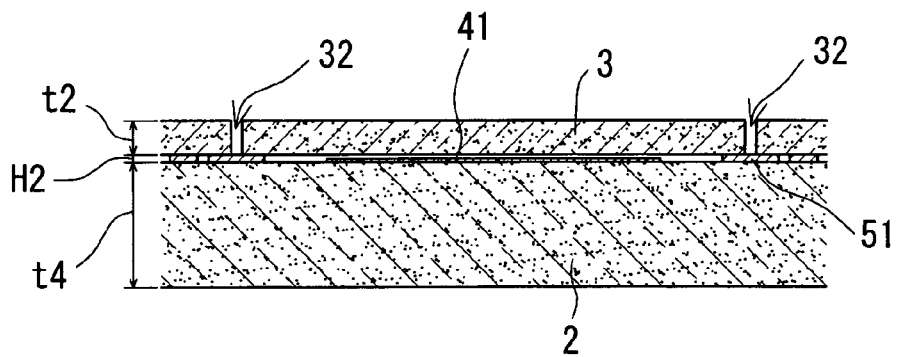
FIG. 9B is a schematic sectional view showing the base member and the lid member after through hole formation by an electronic device package manufacturing method according to another modification example of the above embodiment.

In general, a member having a thickness of not greater than 90 μm (substrate or one member after dicing) is very fragile in the single body, and it is difficult to handle the member. Therefore, the conventional method has an issue that the manufacturing of a thin type electronic device package of which the base member or the lid member has a thickness of not greater than 90 μm is difficult. In contrast to this, according to the method of the present embodiment, the plate-shaped lid member 3 is reduced in thickness after the lid member 3 is joined to the base member 2 and before the through holes 32 are formed. Therefore, it becomes possible to easily manufacture a thin type electronic device package in which the thickness t1 of the lid member 3 is set to 90 μm as shown in FIG. 9A by uniformly reducing the thickness of the lid member 3. Furthermore, it is also possible to manufacture an electronic device package in which the thickness t2 of the lid member 3 is set to 40 μm as shown in FIG. 9B.

In practice, the member to be reduced in thickness may be the base member 2 or both the base member 2 and the lid member 3, and it is possible to reduce the thickness of the base member 2 or the lid member 3 to about 25 μm after they are joined together. By thus making the base member 2 or the lid member 3 have a thickness of not smaller than 25 μm and not greater than 90 μm, a further reduction in the thickness of the electronic device package is achieved. FIGS. 9A and 9B show schematic sectional views of a manufacturing process of an electronic device package manufacturing method according to a modification example of the present embodiment, by which the through holes 32 are formed in a direction perpendicular to the lid member 3 by dry etching. In FIGS. 9A and 9B, the insulating layer formed on the lid member 3 is not shown. Moreover, the diameter D1 of the through holes 32 of FIG. 9A is set to 20 μm, the diameter D2 of the internal electrodes 51 (and auxiliary electrodes) is set to 90 μm, and the width W1 of the metal wall portion 55 (and the metal joining portion 43) is set to 40 μm. The height H1 of the internal space is set to 5 μm, the thickness t3 of the base member 2 is set to 250 μm, and the thickness of the external electrodes is set to 50 μm. Therefore, the final thickness of the electronic device package is 395 μm. In FIG. 9B, the height H2 of the internal space is set to 5 μm, the thickness t4 of the base member 2 is set to 200 μm, and the thickness of the external electrodes is set to 50 μm. Therefore, the final thickness of the electronic device package is 295 μm. As described above, if the present method is utilized, the thickness of the base member 2 and the lid member 3 after they are joined together can also be not greater than 250 μm (not greater than 300 μm with regard to the thickness of the electronic device package including the external electrodes).

In this case, although the height of the internal space 61 in which the electronic device 41 is placed depends mainly on the thickness of the metal wall portion 55, the height of the internal space 61 should preferably be not smaller than 1 μm in order to provide an appropriate internal space after joining. This is to prevent the electronic device from coming in contact with the lid member or the like due to the flexion and warp of the lid member and the base member. Moreover, considering that the metal joining portion 43 or the metal wall portion 55 are formed generally in a plating process, the height of the internal space 61 should preferably be not greater than 35 μm.

Figure 10A:
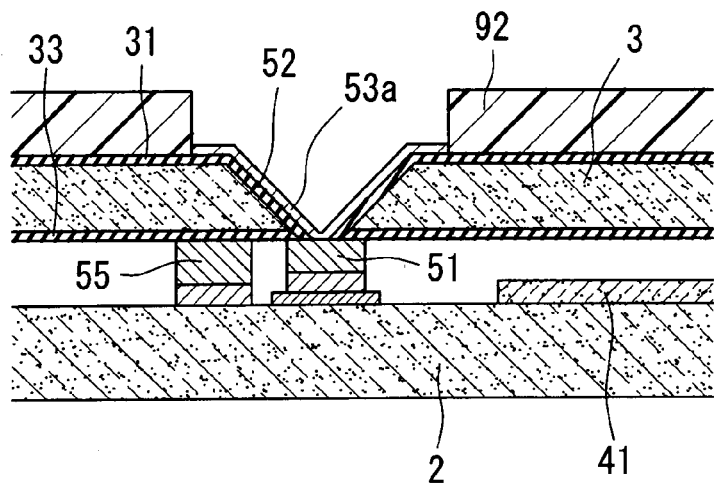
FIG. 10A is a schematic sectional view showing the base member and the lid member after conductive portion formation by an electronic device package manufacturing method according to yet another modification example of the above embodiment.
Figure 10B:
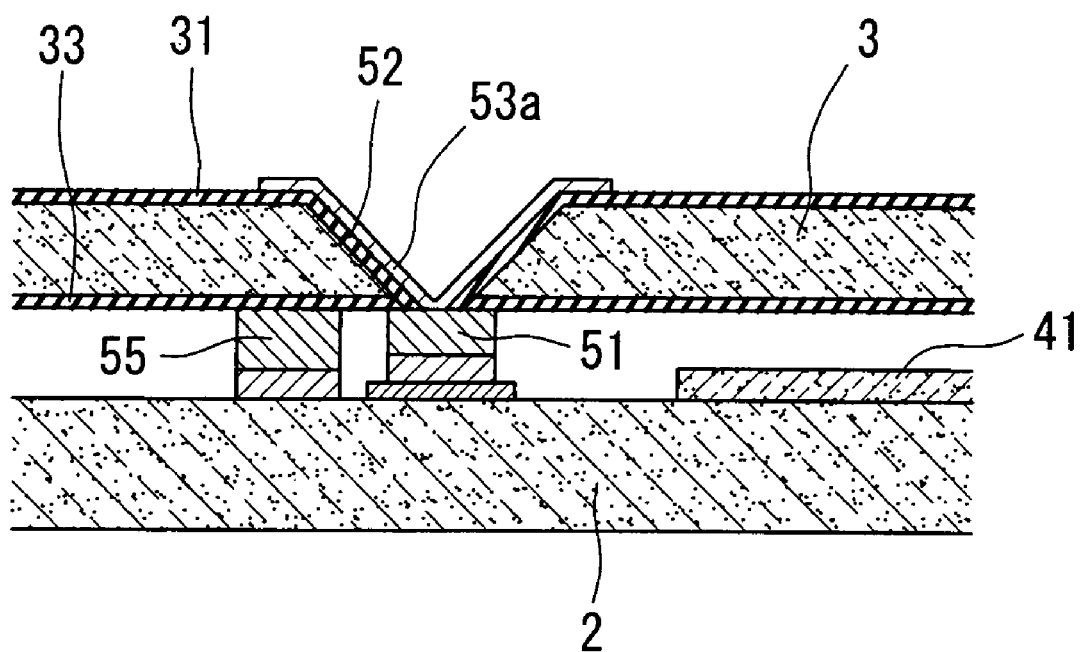
FIG. 10B is a schematic sectional view showing the base member and the lid member after resist film pattern removal by an electronic device package manufacturing method according to the yet another modification example.

An electronic device package manufacturing method according to yet another modification example of the present embodiment is described next. FIGS. 10A and 10B are views for explaining the electronic device package manufacturing processes according to the present modification example, corresponding to FIGS. 8A through 8D.

First of all, when the pattern of the resist film 92 is formed on the surface 31 of the lid member 3 (see FIG. 8B), a conductive material is given to the inner surfaces of the through hole 32 and the periphery of its opening by sputtering, and plating is subsequently performed to form a conductive portion 53a in a film form as shown in FIG. 10A. In this case, for example, a titanium (Ti) film and a gold film or a chromium (Cr) film and a gold film are formed by the sputtering from the insulating layer 52 side, and a film is further formed of copper (Cu) or gold by plating. Subsequently, the resist film 92 is removed, making it possible to make an access to the conductive portion 53a that electrically takes out the internal electrode 51 onto the surface 31 of the lid member 3 as shown in FIG. 10B. Then, an external electrode connected to the internal electrode 51 via the conductive portion 53a is formed in the desired position on the surface 31 (the external electrode is the electrode to be connected to the outside of the electronic device package and allowed to be formed concurrently with the conductive portion 53a). Subsequently, by performing dicing, an electronic device package is completed. As described above, the conductive material can be given to the through hole 32 by a variety of methods, which is appropriately determined according to the application of the electronic device package to be manufactured.

Although the embodiment of the present invention has been described above, the present invention is not limited to the embodiment but allowed to permit a variety of modifications.

The base member 2 and the lid member 3 are not necessarily prepared as parts of the first substrate and the second substrate, respectively. However, in order to efficiently manufacture the electronic device package, it is preferable to prepare a first substrate having a plurality of base members 2 and a second substrate having a plurality of lid members 3 and to concurrently manufacture a plurality of electronic device packages from the substrates. Moreover, the shapes of the base member 2 and the lid member 3 may appropriately be changed, and, for example, the base member 2 or the lid member 3 may have a cavity that forms a space for housing the electronic device 41.

Although the electronic device 41 is provided on the base member 2 in the above embodiment, it is acceptable to place the electronic device in the internal space located in between the base member and the lid member by joining the lid member provided with the electronic device and the internal electrodes to the base member and to electrically take out the internal electrodes to the outside of the internal space by forming through holes that extend from the surface of the lid member opposite from the base member after joining and reach the surfaces of the internal electrodes.

Moreover, it is acceptable to provide an annular metal wall portion for the base member and to provide a metal joining portion corresponding to the metal wall portion for the lid member. By making one of the base member and the lid member have an annular metal wall portion that encloses the electronic device and making the other member have a metal joining portion corresponding to the metal wall portion, highly reliable sealing is achieved in the electronic device package.

The internal electrodes 51 are not necessarily formed on the lid member 3, and it is acceptable to form, for example, auxiliary electrodes with a thickness greater than that of the electronic device and to handle the auxiliary electrodes as the internal electrodes with the surface of the auxiliary electrodes put in contact with the lid member by joining the base member to the lid member. However, in order to prevent the internal space from communicating with the outside via the through holes in forming the through holes, the internal electrodes 51 should preferably be formed on the lid member 3 and joined to the auxiliary electrodes 42 in the joining process.

Although (the surfaces of) the auxiliary electrodes 42, the metal joining portion 43, the internal electrodes 51 and the metal wall portion 55 are made of gold in the above embodiment, these portions may be formed of another metal such as copper, aluminum, solder or the like. It is preferable to use gold, copper or aluminum from the viewpoint of properly performing metal joining with plastic deformation, and it is most preferable to use gold from the point of easily achieving joining with high quality.

Although the lid member 3 is formed of the semiconductive material in the above embodiment, it is preferable to provide an insulating layer on the inner surfaces of the through holes 32 also when the lid member 3 is made of a conductive material, by which the insulation between the conductive portions 53 and the lid member 3 is secured. It is noted that the formation of the insulating layer may be performed by, for example, sputtering of an insulating material besides thermal oxidation. However, the insulating material is given to the portions corresponding to the through holes on the surfaces of the internal electrodes in this case. Therefore, the insulating material on the internal electrodes needs to be removed by etching in order to secure the connection between the conductive portions and the internal electrodes.

When the through holes 32 are formed in step S14 of FIG. 2, it is acceptable to utilize YAG laser, $CO_2$ laser or the like besides anisotropic etching and dry etching.

The electronic device 41 to be housed in the electronic device package is not limited to the SAW filter but allowed to be a variety of other electronic devices such as another MEMS (Micro Electro Mechanical System) of a mechanical switch or the like, a semiconductor circuit and a sensor. However, when an electronic device having a movable structure, an infrared sensor or the like is housed, the internal space should preferably be put in a depressurized sealed state.

The base member 2 needs not be necessarily formed of lithium tantalate but allowed to be, for example, silicon determined according to the kind of the electronic device to be formed. Moreover, when the through holes 32 are formed by a method other than anisotropic etching, the lid member 3 may be formed of glass, ceramic or the like.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The contents of disclosure in the specification, drawings and the scope of the claims for patent of Japanese Patent Application No. 2005-020710 filed on Jan. 28, 2005 are fully incorporated herein by reference.

INDUSTRIAL APPLICABILITY

The present invention can be utilized for an electronic device package where a variety of electronic devices is housed in the internal space and a manufacturing method therefor.

The invention claimed is:

1. An electronic device package manufacturing method comprising:
    joining a first member with a second member via a plurality of internal electrodes such that an electronic device connected to the plurality of internal electrodes is placed between the first member and the second member;
    forming through holes between a surface of the second member that is opposite from a joint surface of the second member that is joined with the first member via the plurality of internal electrodes and joint surfaces of the plurality of internal electrodes at the second member; and
    placing a conductive material in the through holes so as to be connected to the plurality of internal electrodes, to form a plurality of external electrodes on the surface of the second member that is opposite from the joint surface of the second member,
    wherein, by joining (i) one of the first member and the second member that has an annular metal projection portion on a joint surface thereof that is joined with another of the first member and the second member via the plurality of internal electrodes, and (ii) the another of the first member and the second member that has an annular metal joining portion thereon that corresponds to the annular metal projection portion on the joint surface of the one of the first member and the second member, via the plurality of internal electrodes under a depressurized environment, such that the annular metal projection portion and the annular metal joining portion are metallically joined together by a metal joining at a normal temperature, the plurality internal electrodes and the electronic device are placed between the first member and the second member, forming a depressurized sealed space of an annular metal wall portion formed from the annular metal projection portion and the annular metal joining portion.

2. The electronic device package manufacturing method as defined in claim 1, wherein the joining of the first member with the second member is performed by joining the second member of a plate-shaped member to the first member via the plurality internal electrodes.

3. The electronic device package manufacturing method as defined in claim 2, further comprising reducing the second member in a thickness before forming the through holes and after joining the first member and the second member.

4. The electronic device package manufacturing method as defined in claim 3, wherein the second member is reduced in thickness such that the thickness of second member is not smaller than 25 µm and is not greater than 90 µm.

5. The electronic device package manufacturing method as defined in claim 1, wherein the through holes are formed by subjecting the second member to anisotropic etching.

6. The electronic device package manufacturing method as defined in claim 1, further comprising forming an insulating layer on an inner peripheral surface of each of the through holes of the second member that is formed of a conductive material or a semiconductive material, the insulating layer being formed before placing the conductive material in each of the through holes after forming the through holes at the second member.

7. The electronic device package manufacturing method as defined in claim 1, wherein a conductive paste as the conductive material is placed in each of the through holes.

8. The electronic device package manufacturing method as defined in claim 1, wherein the electronic device has a movable structure and is placed in the depressurized sealed space.

9. The electronic device package manufacturing method as defined in claim 1, wherein, by joining a joint surface of the first member of which the electronic device and a plurality of auxiliary electrodes connected to the electronic device are placed with the joint surface of the second member of which the plurality of internal electrodes are placed, the auxiliary electrodes and the plurality of internal electrodes are joined together.

10. An electronic device package manufacturing method comprising:
    joining a first member with a second member via a plurality of internal electrodes such that an electronic device connected to the plurality of internal electrodes is placed between the first member and the second member;
    forming through holes between a surface of the second member that is opposite from a joint surface of the second member that is joined with the first member via the plurality of internal electrodes and joint surfaces of the plurality of internal electrodes at the second member; and
    placing a conductive material in the through holes so as to be connected to the plurality of internal electrodes, to form a plurality of external electrodes on the surface of the second member that is opposite from the joint surface of the second member,
    wherein, by joining (i) one of the first member and the second member that has an annular metal projection portion on a joint surface thereof that is joined with another of the first member and the second member via the plurality of internal electrodes, and (ii) the another of the first member and the second member that has an annular metal joining portion thereon that corresponds to the annular metal projection portion on the joint surface of the one of the first member and the second member, via the plurality of internal electrodes under a depressurized environment, such that the annular metal projection portion and the annular metal joining portion are metallically joined together, the plurality of internal electrodes and the electronic device are placed between the first member and the second member, forming a depressurized sealed space of an annular metal wall portion formed from the annular metal projection portion and the annular metal joining portion, and
    wherein, after the conductive material is placed in each of the through holes, a conductive cover portion, which covers exposed surfaces of the conductive material and each of the through holes, is placed on the surface of the second member that is opposite from the joint surface of the second member.

11. The electronic device package manufacturing method as defined in claim 10, wherein the conductive cover portion is formed by a PVD method.

12. An electronic device package comprising:
    a first member;
    a second member that is formed of a conductive material or a semiconductive material and that is facing the first member;
    an electronic device arranged between the first member and the second member;
    a plurality of internal electrodes connected to the electronic device and arranged between the first member and the second member, such that the plurality of internal electrodes join the first member and the second member together;
    an insulating layer placed on inner peripheral surfaces of a plurality of through holes formed between a surface of the second member that is opposite from a joint surface of the second member that is joined with the first member via the plurality of internal electrodes and joint surfaces of the plurality of internal electrodes at the second member;
    a plurality of external electrodes that are connected to the plurality of internal electrodes with a conductive material placed in the through holes on which the insulating layer is placed and that are formed on the surface of the second member that is opposite from the joint surface of the second member; and
    an annular metal wall portion that forms a depressurized sealed space in which the plurality of internal electrodes and the electronic device are placed between the first member and the second member,
    wherein the annular metal wall portion and the first member or the second member are metallically joined together by metal joining at a normal temperature.

13. The electronic device package as defined in claim 12, wherein each of the external electrodes has a conductive cover portion that covers exposed surfaces of the conductive material and the through holes on the surface of the second member that is opposite from the joint surface of the second member,
    wherein the conductive material placed in the through holes is a conductive paste, and
    wherein the conductive cover is a metal film.

14. The electronic device package as defined in claim 12, wherein the second member is a plate-shaped member having a thickness that is not smaller than 25 µm and is not greater than 90 µm.

* * * * *

UNITED STATES PATENT AND TRADEMARK OFFICE
CERTIFICATE OF CORRECTION

| | | |
|---|---|---|
| PATENT NO. | : 7,615,406 B2 | Page 1 of 1 |
| APPLICATION NO. | : 11/883166 | |
| DATED | : November 10, 2009 | |
| INVENTOR(S) | : Kazushi Higashi et al. | |

It is certified that error appears in the above-identified patent and that said Letters Patent is hereby corrected as shown below:

On the Title page, Item (86), PCT No.:

"PCT/JP2006/001209" should read -- PCT/JP2006/301209 --.

Signed and Sealed this

Eleventh Day of May, 2010

David J. Kappos
*Director of the United States Patent and Trademark Office*